United States Patent
Seo et al.

(10) Patent No.: US 10,757,239 B2
(45) Date of Patent: Aug. 25, 2020

(54) ELECTRONIC DEVICE INCLUDING ELECTRONIC PART AND EARPHONE JACK ASSEMBLY

(71) Applicant: Samsung Electronics Co., Ltd., Gyeonggi-do (KR)

(72) Inventors: Jae Il Seo, Gyeonggi-do (KR); Ki Jae Kim, Seoul (KR); Dae Young Noh, Seoul (KR); Soon Woong Yang, Gyeonggi-do (KR); Yong Lak Cho, Gyeongsangbuk-do (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 29 days.

(21) Appl. No.: 16/108,280

(22) Filed: Aug. 22, 2018

(65) Prior Publication Data
US 2019/0068770 A1   Feb. 28, 2019

(30) Foreign Application Priority Data

Aug. 25, 2017  (KR) ........................ 10-2017-0107910

(51) Int. Cl.
| H04M 1/60 | (2006.01) |
| H01R 13/74 | (2006.01) |
| H04M 1/02 | (2006.01) |
| G06F 1/16 | (2006.01) |
| H05K 1/02 | (2006.01) |

(Continued)

(52) U.S. Cl.
CPC ........ *H04M 1/6058* (2013.01); *G06F 1/1605* (2013.01); *G06F 1/1643* (2013.01); *G06F 3/0412* (2013.01); *H01R 13/74* (2013.01); *H04M 1/0274* (2013.01);
(Continued)

(58) Field of Classification Search
USPC ....... 381/26, 58, 71.6, 74, 92, 355, 381, 394
See application file for complete search history.

(56) References Cited

U.S. PATENT DOCUMENTS

| 8,150,046 B2 | 4/2012 | Hansson et al. |
| 8,559,650 B2 | 10/2013 | Seo |

(Continued)

FOREIGN PATENT DOCUMENTS

CN   106785704 A   5/2017

OTHER PUBLICATIONS

European Search Report dated Jan. 23, 2019.

*Primary Examiner* — Yosef K Laekemariam
(74) *Attorney, Agent, or Firm* — Cha & Reiter, LLC

(57) ABSTRACT

An electronic device includes an earphone jack assembly disposed to align with an opening in the housing of the electronic device. The earphone jack assembly includes at least one structure including a first passage having a first cross-sectional area, a second passage having a second cross-sectional area smaller than the first cross-sectional area, a third passage, and a microphone disposed outside of the at least one structure and including a substrate having a hole connected to the third passage. The first passage extends from the opening in a first direction, and includes a first end connected to the opening and a second end opposite to the first end, the second passage extends from the second end of the first passage in the first direction, and the third passage extends from the second passage in a second direction different from the first direction.

20 Claims, 18 Drawing Sheets

(51) Int. Cl.
*G06F 3/041* (2006.01)
*H04R 1/08* (2006.01)

(52) U.S. Cl.
CPC ............ *H04R 1/086* (2013.01); *H05K 1/028* (2013.01); *H04R 2499/11* (2013.01)

(56) References Cited

U.S. PATENT DOCUMENTS

| | | | |
|---|---|---|---|
| 8,655,007 B2 | 2/2014 | Hansson et al. | |
| 8,811,647 B2 | 8/2014 | Hansson et al. | |
| 9,031,620 B2 | 5/2015 | Ko et al. | |
| 9,628,595 B2 | 4/2017 | Ko et al. | |
| 2010/0215183 A1* | 8/2010 | Hansson | H04R 1/1033 381/58 |
| 2011/0216912 A1 | 9/2011 | Seo | |
| 2012/0142225 A1 | 6/2012 | Hansson et al. | |
| 2012/0144072 A1 | 6/2012 | Hansson et al. | |
| 2012/0314354 A1* | 12/2012 | Rayner | H05K 5/061 361/679.01 |
| 2013/0012274 A1 | 1/2013 | Ko et al. | |
| 2013/0222192 A1* | 8/2013 | Seo | H01Q 1/243 343/702 |
| 2015/0023510 A1* | 1/2015 | Shimizu | H04R 29/00 381/58 |
| 2015/0244845 A1 | 8/2015 | Ko et al. | |
| 2017/0214986 A1 | 7/2017 | Sung et al. | |

* cited by examiner

A-A'

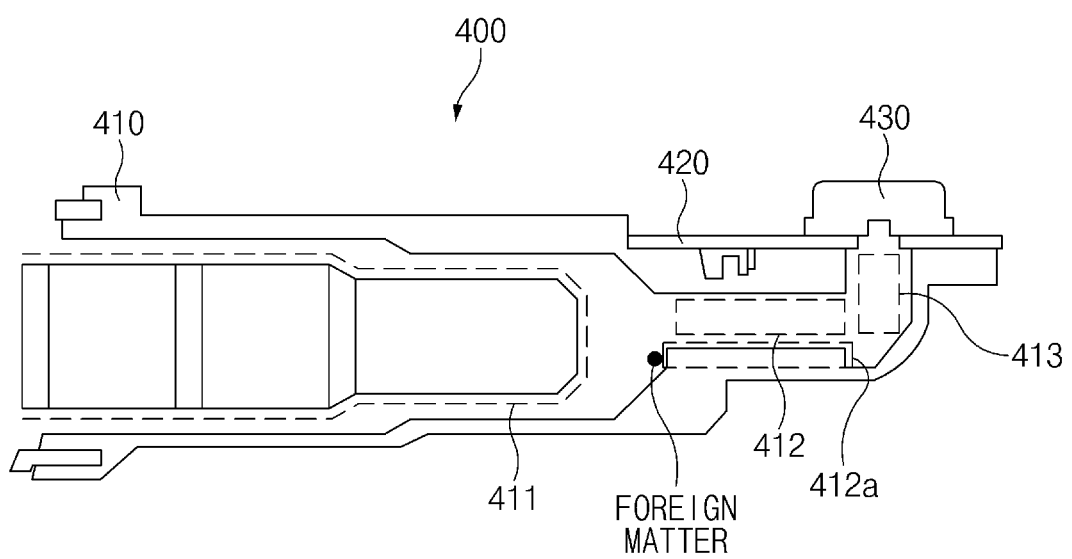
F I G. 4A

A-A'

A-A'

A-A'

ELECTRONIC DEVICE INCLUDING ELECTRONIC PART AND EARPHONE JACK ASSEMBLY

CROSS-REFERENCE TO RELATED APPLICATION(S)

This application is based on and claims priority under 35 U.S.C. § 119 to Korean Patent Application No. 10-2017-0107910, filed on Aug. 25, 2017, in the Korean Intellectual Property Office, the disclosure of which is incorporated by reference herein its entirety.

BACKGROUND

1. Field

Embodiments of the present disclosure described herein generally relate to the placement of an earphone jack assembly and electronic parts, such as a microphone, a speaker, etc., in an electronic device.

2. Description of Related Art

Electronic devices may include various electronic parts, such as a microphone, a speaker, a camera, a humidity sensor, etc. One such electronic device may include, for example, a plurality of microphones to meet increasing user demand for better audio performance or better phone call quality. The electronic device may implement improved noise suppression, echo cancellation, beam-forming, or the like by using the plurality of microphones. The plurality of microphones may be located at a plurality of positions, such as the lower end, the upper end, the front surface, the rear surface, etc. of the electronic device.

The above information is presented as background information only to assist with an understanding of the present disclosure. No determination has been made, and no assertion is made, as to whether any of the above might be applicable as prior art with regard to the present disclosure.

SUMMARY

When the electronic device includes the plurality of microphones, holes for the plurality of microphones may be formed on the outside of the housing of the electronic device, and therefore the aesthetic appearance of the electronic device may be negatively impacted. Furthermore, separate spaces inside the electronic device may have to be provided for the plurality of microphones.

According to one embodiment of the present disclosure, an electronic device may include an electronic part disposed adjacent to a passage for the insertion of an earphone connector.

In accordance with an aspect of the present disclosure, an electronic device includes a housing including a first plate, a second plate facing away from the first plate, and a side member surrounding a space between the first plate and the second plate and including an opening, a touch screen display exposed through the first plate, and an earphone jack assembly disposed to align with the opening. The earphone jack assembly includes at least one structure including a first passage having a first cross-sectional area, a second passage having a second cross-sectional area smaller than the first cross-sectional area, and a third passage and a microphone disposed on the outside of the structure and including a substrate having a hole connected to the third passage. The first passage extends from the opening in a first direction to accommodate an external earphone connector, and includes a first end connected to the opening and a second end opposite to the first end, the second passage extends from the second end of the first passage in the first direction, and the third passage extends from the second passage in a second direction different from the first direction.

In accordance with another aspect of the present disclosure, an input/output module includes an earphone jack housing including a first passage, a second passage, and a third passage and a microphone disposed on a first peripheral housing of the earphone jack housing, where the first peripheral housing includes an opening connected to the third passage and the microphone includes a hole connected to the third passage. The first passage accommodates an external earphone connector inserted through another opening, extends from the other opening in a first direction, and includes a first end connected to the other opening and a second end opposite to the first end, the second passage extends from the second end in the first direction, and the third passage extends from the second passage in a second direction different from the first direction.

In accordance with another aspect of the present disclosure, an electronic device includes a housing including a first plate, a second plate facing away from the first plate, and a side member surrounding a space between the first plate and the second plate and including a first opening and an input/output module disposed between the first plate and the second plate. The input/output module includes an earphone jack housing including a first passage having a second opening, a second passage, and a third passage and a microphone disposed on a first peripheral housing of the earphone jack housing, where the first peripheral housing includes a third opening connected to the third passage, and the microphone includes a hole connected to the third passage. The first passage accommodates an external earphone connector inserted through the first opening and the second opening, extends from the second opening in a first direction, and includes a first end connected to the second opening and a second end opposite to the first end, the second passage extends from the second end in the first direction, and the third passage extends from the second passage in a second direction different from the first direction. The second direction is a direction toward the first plate or the second plate.

According to embodiments of the present disclosure, a sound input path may be ensured by using a hole for the insertion of an earphone connector, which enables a plurality of microphones to be mounted in an electronic device without affecting the appearance of the electronic device.

According to embodiments of the present disclosure, sound may be effectively obtained by making the cross-sectional area of a passage used for the introduction of sound smaller than that of a passage for the insertion of an earphone connector.

According to embodiments of the present disclosure, an electronic part (e.g., a microphone) may be arranged in the longitudinal direction of a passage for accommodating an earphone connector to make the electronic device compact and may face an earphone jack housing in the thickness direction of the electronic device so that it is in close contact with the earphone jack housing.

In addition, the present disclosure may have other properties that may be directly or indirectly recognized by one of skill in the art in view of the present disclosure.

Various aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 4A is a sectional view of an earphone jack assembly including a stopper in a second passage of the earphone jack assembly according to an embodiment;

Throughout the drawings, it should be noted that like reference numerals are used to depict the same or similar elements, features, and structures.

DETAILED DESCRIPTION

Hereinafter, various embodiments of the present disclosure may be described with reference to accompanying drawings. Accordingly, those of ordinary skill in the art will recognize that various modifications, equivalents, and/or alternatives on the various embodiments described herein can be made without departing from the scope and spirit of the present disclosure.

Figure 1A:
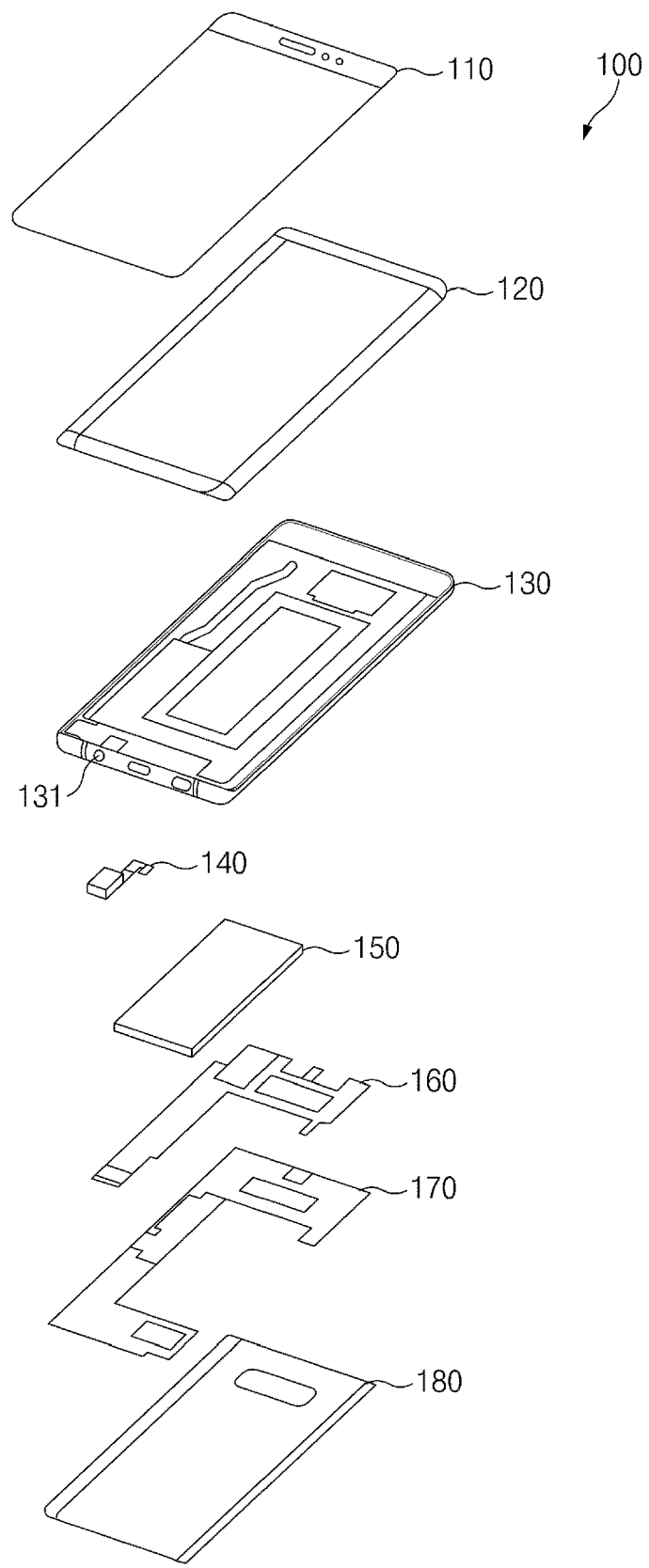
FIG. 1A and FIG. 1B are exploded perspective views of an electronic device according to an embodiment.
Figure 1B:
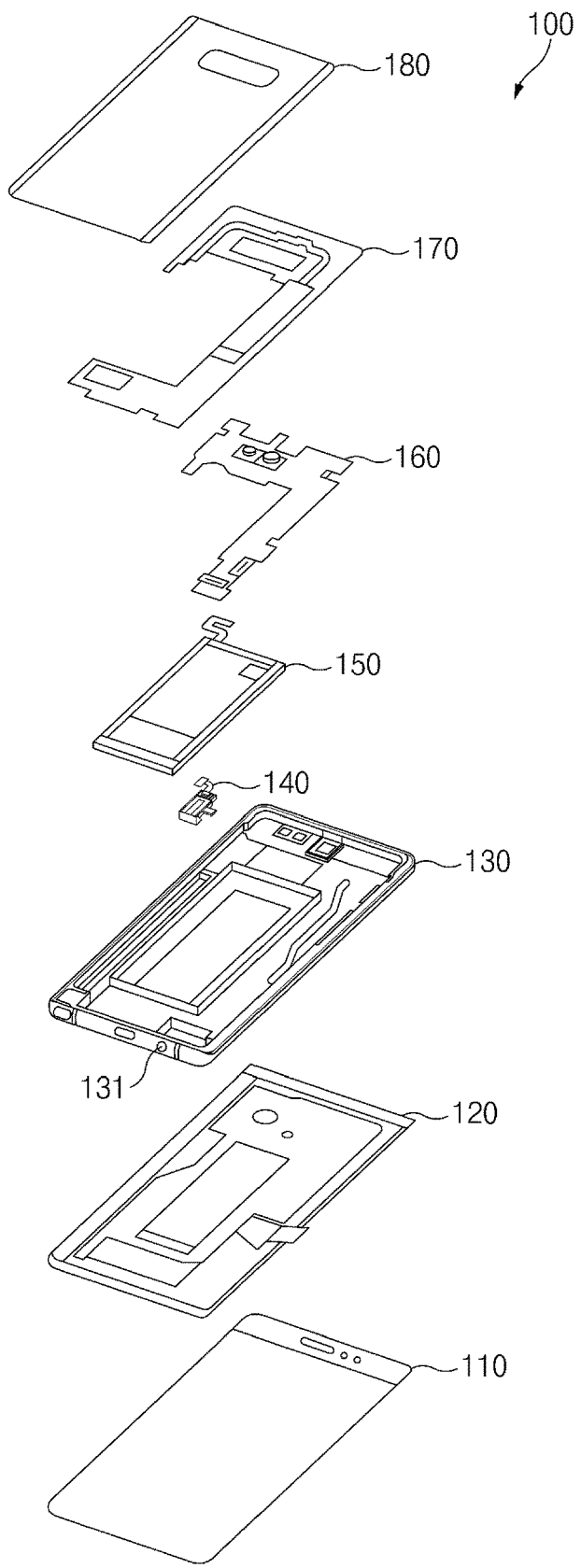

FIGS. 1A and 1B are exploded perspective views of an electronic device according to an embodiment.

Referring to FIGS. 1A and 1B, an electronic device 100 according to an embodiment may include a front plate 110, a display 120, a side member 130, an earphone jack assembly 140, a battery 150, a printed circuit board 160, a support member (e.g., a bracket) 170, and a back plate 180. According to various embodiments, the electronic device 100 may not include some of the components illustrated in FIGS. 1A and 1B and may further include additional components that are not illustrated in FIGS. 1A and 1B.

The front plate (or cover glass) 110 may be transparent so that light generated by the display 120 passes through the front plate 110. Furthermore, a user may touch the front plate 110 with a part (e.g., a finger) of the user's body or another device (e.g. an electronic pen) to perform touch input and/or fingerprint authentication. The front plate 110 may be made of, for example, reinforced glass, reinforced plastics, a polymer, or the like so that it may protect the display 120 and other components included in the electronic device 100 from external shocks. In one or more embodiments, the front plate 110 may also be referred to as a glass window.

According to an embodiment, the front plate 110 may be curved at one side or the two opposite longitudinal sides thereof. Furthermore, according to an embodiment, the front plate 110 may have at least one rounded corner at the periphery thereof. Although the front plate 110 illustrated in FIGS. 1A and 1B has two rounded corners at the lower end thereof, embodiments of the front plate 110 are not so limited. For example, all of the four corners of the front plate 110 may be rounded, or none of the corners may be rounded.

According to an embodiment, the display 120 may be disposed on or coupled to the bottom of the front plate 110, and at least a portion of the display 120 may be exposed through at least a portion of the front plate 110. The display 120 may output contents (e.g., text, image, video, icons, widgets, symbols, etc.) or may receive touch inputs (e.g., touch inputs, gesture inputs, hovering inputs, etc.) from the user. The display 120 may include, for example, a display panel, a touch panel, and/or a fingerprint sensor. The rear surface of the display panel 120 may be called a back panel and may be made of copper (Cu) or graphite.

According to an embodiment, at least a portion of one side or the two opposite sides longitudinal of the display 120 may be curved. Furthermore, according to an embodiment, the display 120 may have at least one rounded corner at the periphery thereof. Although the display 120 illustrated in FIGS. 1A and 1B has two rounded corners at the lower end thereof, embodiments of the display 120 are not so limited. For example, all of the four corners of the display 120 may be rounded, or none of the corners may be rounded.

According to an embodiment, the display panel of the display 120 may include an LCD panel, an LED display panel, an OLED display panel, a MEMS display panel, or an electronic paper display panel. Furthermore, the touch panel included in the display 120 may include, for example, a capacitive touch panel, a pressure-sensitive touch panel, a resistive touch panel, or an infrared touch panel.

According to an embodiment, the side member 130 may be disposed between the front plate 110 and the back plate 180 to accommodate components of the electronic device 100. The side member 130 may form the lateral side of the electronic device 100. According to an embodiment, the side member 130 may include, in a partial area thereof, an opening 131 through which an external earphone connector passes. In one or more embodiments, the side member 130 may also be referred to as the front case, the rear case, etc. of the electronic device 100.

According to an embodiment, the earphone jack assembly (or input/output module) 140 may include an output module that transmits an electrical signal to an external earphone connector through a contact terminal. The electrical signal can later be converted to sound. The earphone jack assembly 140 may also include an input module that receives sound through a microphone. According to an embodiment, the earphone jack assembly 140 may be disposed close to the opening 131 of the side member 130. According to an embodiment, the earphone jack assembly 140 may include an opening which accommodates an earphone connector, and the opening of the earphone jack assembly 140 may be aligned with the opening 131 of the side member 130. The structure of the earphone jack assembly 140 will be described in more detail with reference to FIGS. 2A to 6B.

The battery 150 may convert chemical energy into electrical energy, and vice versa. For example, the battery 150 may convert chemical energy into electrical energy and may supply the electrical energy to the display 120 and the various components or modules mounted on the printed circuit board 160. The battery 150 may also convert electrical energy supplied from an external device connected to the electronic device 100 (e.g. a charger) into chemical energy and may store the chemical energy. To this end, a power management module for managing charging and discharging of the battery 150 may be included in the printed circuit board 160.

According to an embodiment, the printed circuit board 160 may be disposed between the side member 130 and the support member 170. The printed circuit board 160 may be implemented with, for example, a rigid printed circuit board (rigid PCB). The printed circuit board 160 may be referred to as a main board, a printed board assembly (PBA), or simply a PCB. Various electronic components (e.g., processor, memory, etc.), printed circuits, and the like of the electronic device 100 may be mounted or arranged on the printed circuit board 160.

According to an embodiment, the support member 170 may be made of, for example, a magnesium alloy, an aluminum alloy, stainless steel, plastic, etc. and may be disposed between the side member 130 and the back plate 180. The support member 170 may be coupled with the side member 130 and the printed circuit board 160 to physically support the side member 130 and the printed circuit board 160.

According to an embodiment, the back plate 180 may be coupled to a rear surface of the electronic device 100. The back plate 180 may be made of reinforced glass, a plastic injection-molded material, metal, etc.

Figure 2A:
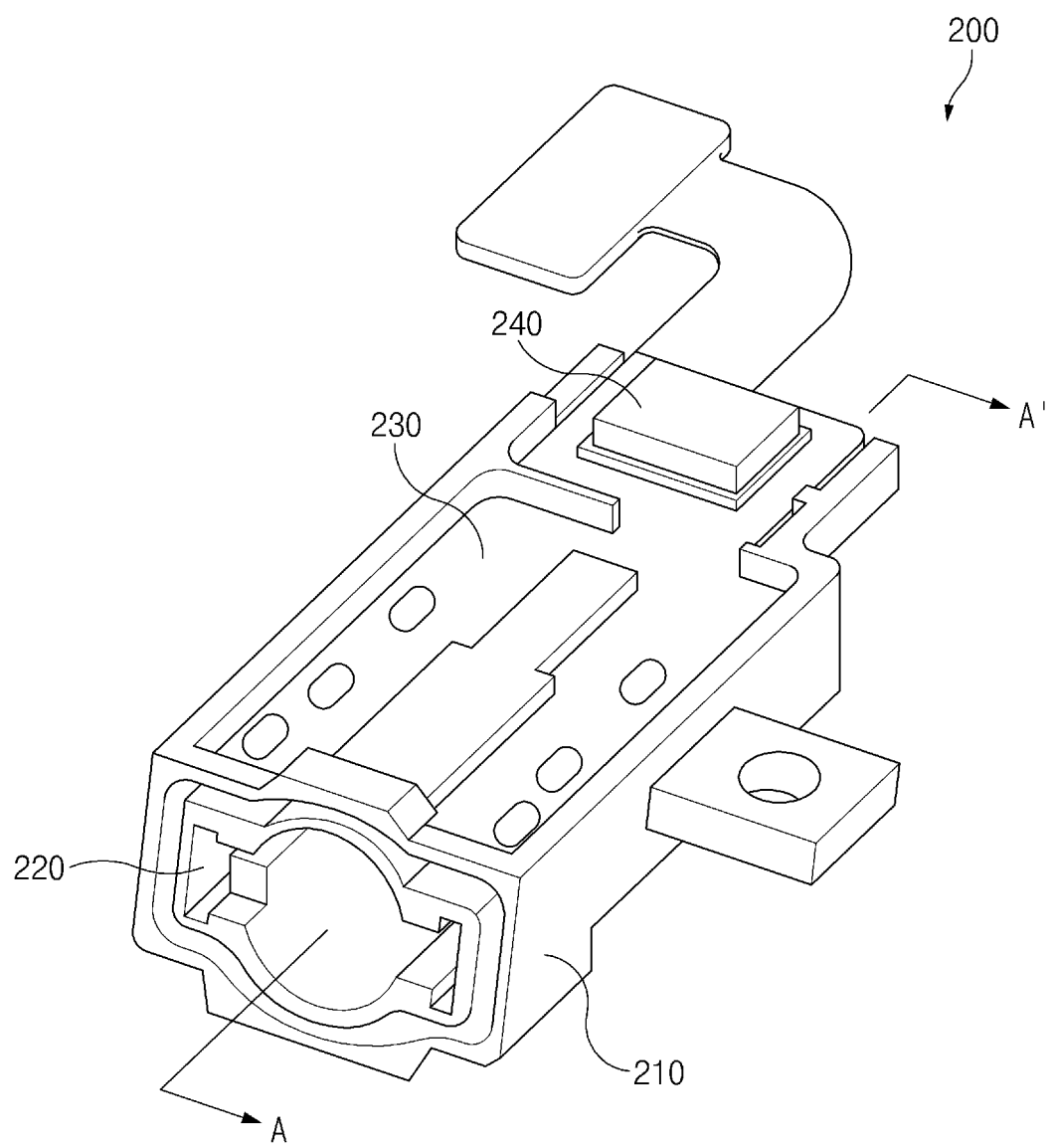
FIG. 2A is a perspective view of an earphone jack assembly according to an embodiment.
Figure 2B:
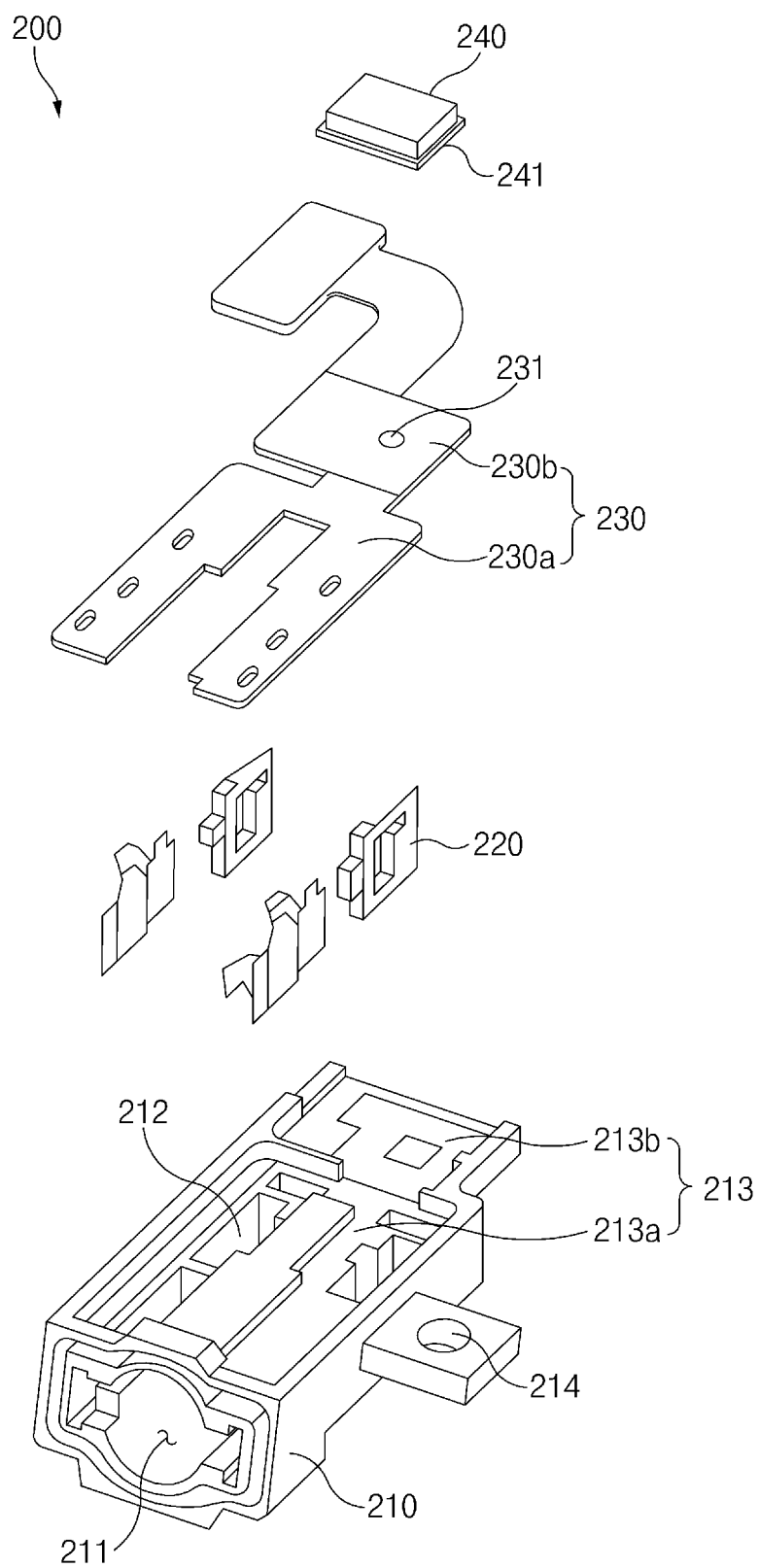
FIG. 2B is an exploded perspective view of the earphone jack assembly according to an embodiment.

FIG. 2A is a perspective view of an earphone jack assembly according to an embodiment. FIG. 2B is an exploded perspective view of the earphone jack assembly according to an embodiment.

Referring to FIGS. 2A and 2B, an earphone jack assembly 200 according to an embodiment may include an earphone jack housing (or structure) 210, at least one terminal 220, a printed circuit board (PCB) 230, and a microphone 240. According to various other embodiments, the earphone jack assembly 200 may not include some of the components illustrated in FIGS. 2A and 2B and may further include additional components that are not illustrated in FIGS. 2A and 2B. The PCB 230 may be a flexible printed circuit board (FPCB).

According to an embodiment, the earphone jack housing 210 may include a passage 211 in which an earphone connector is accommodated and into which external sound may be introduced. According to an embodiment, the earphone jack housing 210 may include a terminal mounting part 212 in which the at least one terminal 220 is mounted and a PCB mounting part 213 on which the PCB 230 is mounted. According to an embodiment, the PCB mounting part 213 may include an earphone PCB mounting part 213a and a microphone PCB mounting part 213b. According to an embodiment, the earphone jack housing 210 may further include a coupling part 214 that allows the earphone jack assembly 200 to be coupled to another member of the electronic device 100 via a coupling member (e.g., a screw). An embodiment in which the earphone jack housing 210 is coupled with a support member of the electronic device 100 will be described below with reference to FIGS. 9A and 9B. According to another embodiment, the coupling part 214 may be omitted.

According to an embodiment, the terminal 220 may electrically connect the PCB 230 and an inserted earphone connector. For example, when the earphone connector is inserted into the passage 211 of the earphone jack housing 210, each electrode of the earphone connector may be electrically connected to the PCB 230 through the terminal 220, and the PCB 230 may transfer an electrical signal to the earphones through the terminal 220.

According to an embodiment, the PCB 230 may include an earphone PCB 230a for the output of a sound signal, a microphone PCB 230b for the input of a sound signal. The earphone PCB 230a may be mounted on at least a portion of the earphone jack housing 210 and may be electrically connected to the earphone connector through the at least one terminal 220. According to an embodiment, the portion of the earphone jack housing 210 on which the earphone PCB 230a is mounted may be the earphone PCB mounting part 213a, which may correspond to the shape of the earphone PCB 230a. The microphone PCB 230b may be mounted on at least a portion of the earphone jack housing 210 and may be electrically connected to the microphone 240. According to an embodiment, the portion of the earphone jack housing 210 on which the microphone PCB 230b is mounted may be the microphone PCB mounting part 213b, which may correspond to the shape of the microphone PCB 230b. According to an embodiment, the microphone PCB 230b may include a through-hole 231 that connects a hole of the microphone 240 to the passage 211 of the earphone jack housing 210. The hole of the microphone 240 may be implemented to facilitate the reception of sounds by the microphone 240.

According to an embodiment, the microphone 240 may obtain a sound signal introduced through the passage 211 of the earphone jack housing 210. The microphone 240 may be mounted on the microphone PCB 230b and may transfer the obtained sound signal to the microphone PCB 230b. According to an embodiment, the microphone 240 may include a substrate 241 that has a hole connected to the passage 211 of the earphone jack housing 210. According to an embodiment, the microphone 240 may include a micro electro mechanical system (MEMS) microphone.

According to another embodiment, the microphone 240 of FIGS. 2A and 2B may be replaced with a speaker or a sensor (e.g., temperature sensor, humidity sensor, etc.).

Figure 3:
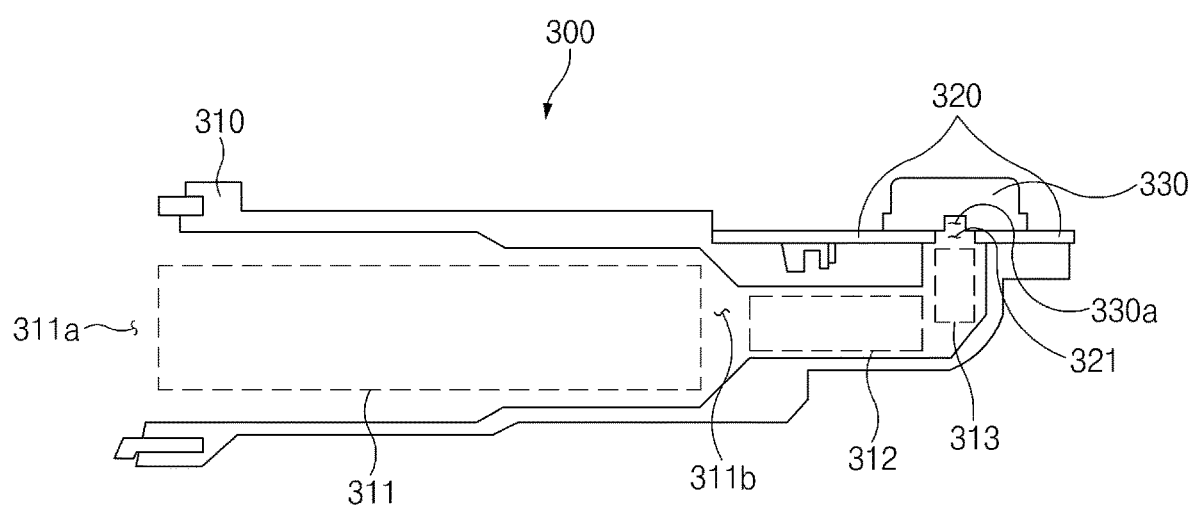
FIG. 3 is a sectional view of an earphone jack assembly according to an embodiment.

FIG. 3 is a sectional view of an earphone jack assembly according to an embodiment. The sectional view of FIG. 3 may be a sectional view taken along line A-A' of FIG. 2A.

Referring to FIG. 3, according to an embodiment, an earphone jack assembly 300 may include an earphone jack housing 310, a PCB 320, and a microphone 330. According to various other embodiments, the earphone jack assembly 300 (e.g., the earphone jack assembly 200 of FIGS. 2A and 2B) may not include some of the components illustrated in FIG. 3 and may further include additional components that are not illustrated in FIG. 3.

According to an embodiment, the earphone jack housing 310 may include a first passage 311, a second passage 312, and a third passage 313. According to an embodiment, the first passage 311 may extend from the opening of the earphone jack housing 310 in a first direction and may accommodate an external earphone connector when it is inserted into the earphone jack housing 310. According to an embodiment, the first passage 311 may include a first end 311a coinciding with the opening and a second end 311b opposite to the first end 311a. According to an embodiment, the external earphone connector may be inserted in the direction from the first end 311a to the second end 311b. According to an embodiment, the second passage 312 may extend from the second end 311b of the first passage 311 in the first direction. As shown in FIG. 3, the first direction may be from the left of the drawing to the right. According to an embodiment, the third passage 313 may extend from the second passage 312 in a second direction different from the first direction and may form an opening. According to an embodiment, the second direction may be substantially perpendicular to the first direction. As shown in FIG. 3, the second direction may be from the bottom of the drawing to the top.

According to an embodiment, the first passage 311 may have a first cross-sectional area, and the second passage 312 may have a second cross-sectional area. According to an embodiment, the second cross-sectional area may be smaller than the first cross-sectional area. The first passage 311 and the second passage 312 may form one passage. According to an embodiment, an area of a first cross section of the one passage may be smaller than an area of a second cross section of the one passage and the first cross section is closer to the second end than the third passage.

According to an embodiment, the PCB 320 may be electrically connected to at least one terminal (e.g., the terminal 220 of FIGS. 2A and 2B) and may have the microphone 330 (e.g., the microphone 240 of FIGS. 2A and 2B) mounted thereon. According to an embodiment, the PCB 320 may be disposed on at least a portion of the earphone jack housing 310. According to an embodiment, the PCB 320 may include a through-hole 321. According to an embodiment, the PCB 320 may be disposed on a first peripheral housing of the earphone jack housing 310 that forms the periphery of the third passage 313 such that the through-hole 321 is connected to the third passage 313 of the earphone jack housing 310. According to an embodiment, when viewed from above, at least a portion of the through-hole 321 of the PCB 320 may overlap at least a portion of the opening of the third passage 313.

According to an embodiment, the microphone 330 may be disposed on the outside of the earphone jack housing 310 such that a microphone hole 330a is connected to the third passage 313. Thus, according to an embodiment, sound introduced into the opening of the earphone jack housing 310 may be input to the microphone hole 330a via the first passage 311, the second passage 312, and the third passage 313.

Figure 4B:
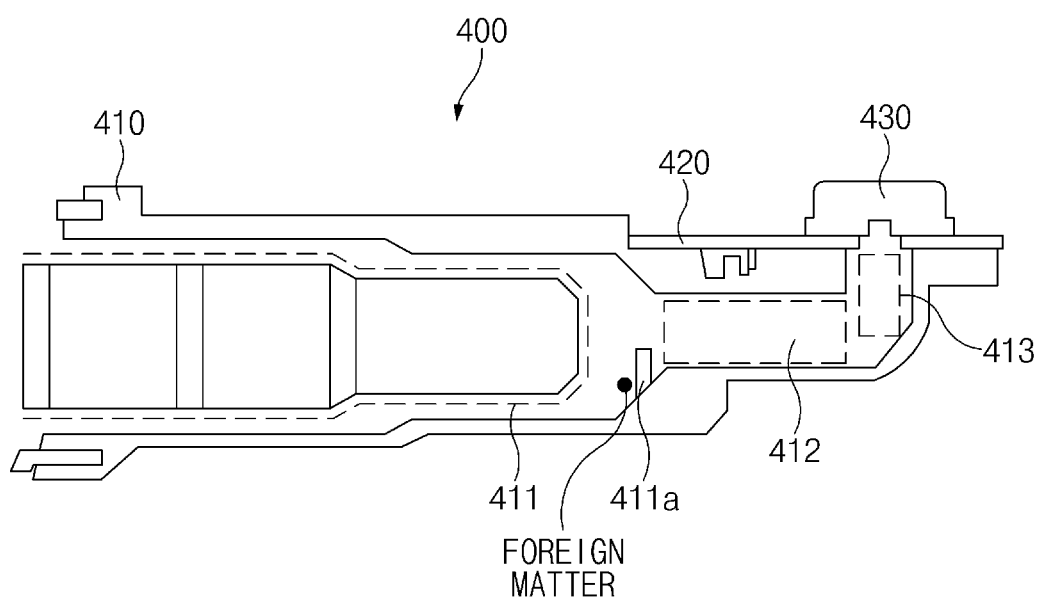
FIG. 4B is a sectional view of an earphone jack assembly including a stopper in a first passage of the earphone jack assembly according to another embodiment.

FIGS. 4A and 4B are sectional views of earphone jack assemblies that include a stopper in the passage of the earphone jack assemblies according to two embodiments, respectively. The sectional views of FIGS. 4A and 4B may be sectional views taken along line A-A' of FIG. 2A.

According to an embodiment, the earphone jack assembly 400 of FIGS. 4A and 4B may be a modified version of the earphone jack assembly 300 of FIG. 3. Referring to FIGS. 4A and 4B, the earphone jack assembly 400 may include an earphone jack housing 410, a PCB 420, a microphone 430, etc. In the description of FIGS. 4A and 4B, repetitive descriptions of the same components as those illustrated in FIG. 3 will be omitted.

Referring to FIG. 4A, the earphone jack housing 410 may include a stopper 412a protruding from a sidewall of the second passage 412. According to an embodiment, foreign matter (e.g., moisture) may be introduced into the earphone jack housing 410 while an earphone connector is being inserted into the first passage 411. The introduced foreign matter may clog the second passage 412 or the third passage 413 to hinder the reception of sounds by the microphone 430. The stopper 412a formed on the sidewall of the second passage 412 may prevent foreign matter from being introduced into the passages 412 and 413. Thus, interference of the operations of the microphone 430 due to foreign matter is reduced.

Referring to FIG. 4B, the earphone jack housing 410 may include a stopper 411a protruding from a sidewall of the first passage 411. The stopper 411a formed in the first passage 411 may prevent foreign matter introduced into the earphone jack housing 410 from entering the second passage 412 and the third passage 413.

Figure 5A:
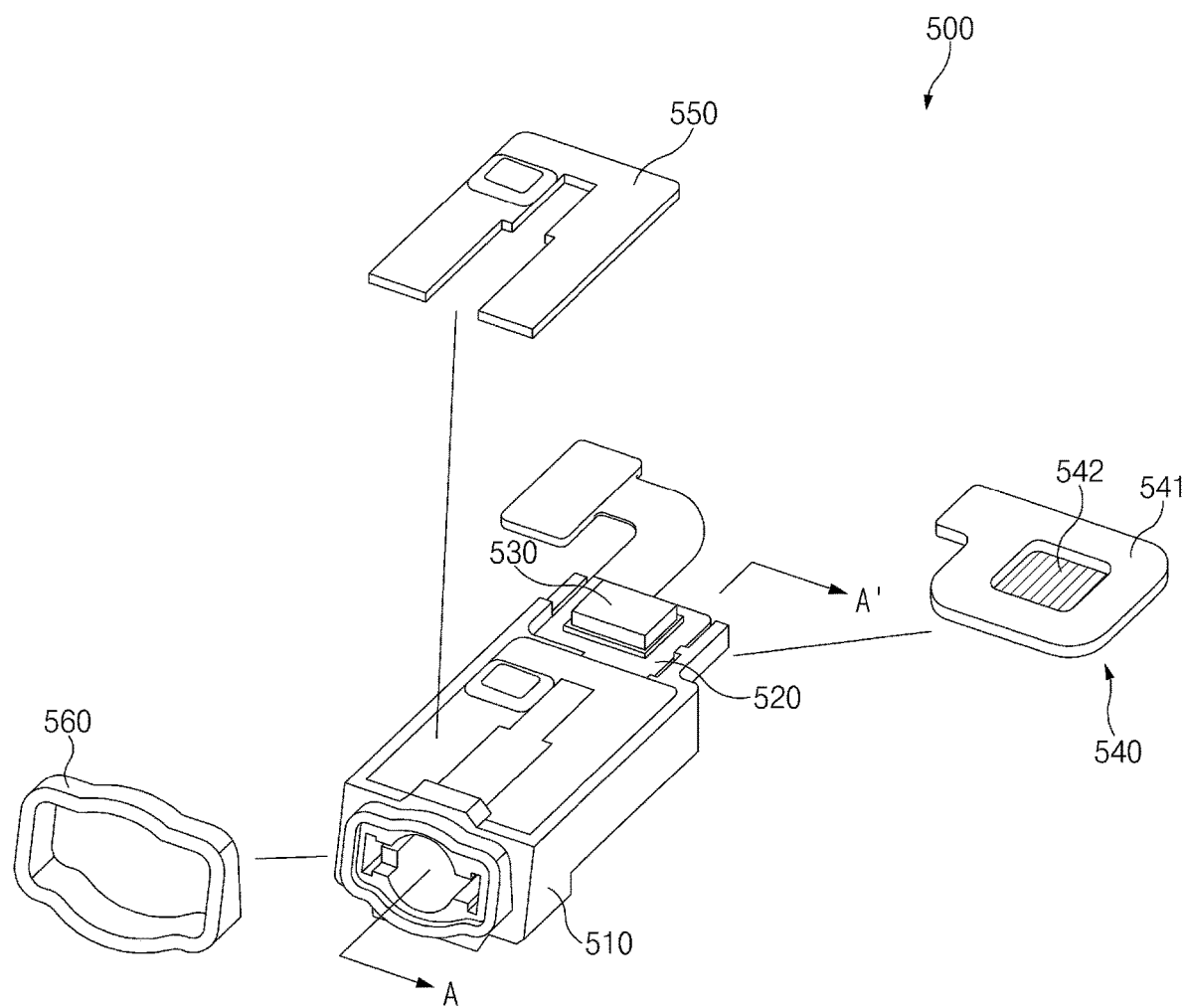
FIG. 5A is a perspective view of an earphone jack assembly including a sealing member according to an embodiment.
Figure 5B:
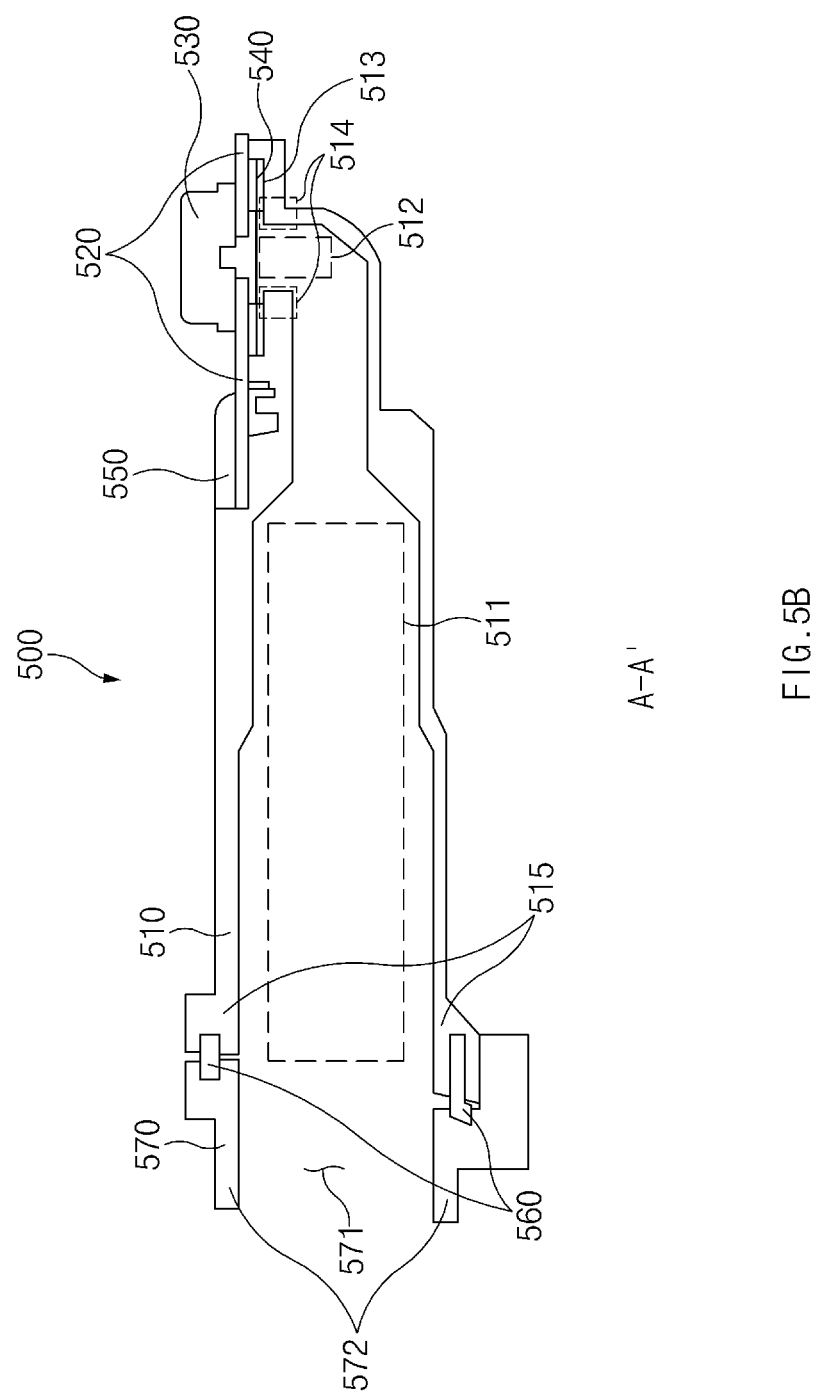
FIG. 5B is a sectional view of an earphone jack assembly including the sealing member and a side member according to an embodiment.

FIG. 5A is a perspective view of an earphone jack assembly including a sealing member according to an embodiment. FIG. 5B is a sectional view of an earphone jack assembly including the sealing member and a side member according to an embodiment. The sectional view of FIG. 5B may be a sectional view taken along line A-A' of FIG. 5A.

According to an embodiment, the earphone jack assembly 500 of FIGS. 5A and 5B may be a modified version of the earphone jack assembly 300 of FIG. 3. Referring to FIGS. 5A and 5B, the earphone jack assembly 500 may include an earphone jack housing 510, a PCB 520, a microphone 530, etc.

According to an embodiment, the earphone jack assembly 500 may include at least one of a first sealing member 540, a second sealing member 550, and a third sealing member 560. In the description of FIGS. 5A and 5B, repetitive descriptions of the same components as those illustrated in FIG. 3 will be omitted. In the following description, the reference numerals used above may be used.

According to an embodiment, the first sealing member 540 may be disposed between the microphone 530 and a first peripheral housing 514 that forms an opening connected to a third passage 512. According to an embodiment, the first sealing member 540 may be disposed between the first peripheral housing 514 and the PCB 520 when the PCB 520 is disposed between the first peripheral housing 514 and the microphone 530. According to an embodiment, the first sealing member 540 may be disposed on a microphone mounting part 513 of the earphone jack housing 510.

According to an embodiment, the first sealing member 540 may include a waterproof member that allows air to pass through it, prevents moisture infiltration in one direction, and induces discharge of moisture in the opposite direction. For example, the first sealing member 540 may prevent moisture infiltration toward the microphone 530 from the third passage 512 and may induce discharge of moisture toward the third passage 512 from the microphone 530.

According to an embodiment, as illustrated in FIG. 5A, the first sealing member 540 may include a loop-shaped tape 541 and Gore-Tex 542 located in the tape 541.

According to an embodiment, the second sealing member 550 may be disposed to cover at least a portion of the PCB 520. According to an embodiment, the first passage 511 of the earphone jack housing 510 may be open at the top thereof so that at least one terminal can be inserted. The second sealing member 550 may block moisture introduced through the top of the first passage 511. According to an embodiment, the second sealing member 550 may include epoxy. In such an embodiment, liquid epoxy may be applied to the at least one terminal and at least a portion of the PCB 520. According to an embodiment, in the case where the liquid epoxy is applied to only the terminal and the portion of the PCB 520, the epoxy may not clog the microphone hole.

According to an embodiment, the third sealing member 560 may be disposed between a second peripheral housing 572 of a side member 570 that forms an opening 571 and a third peripheral housing 515 that forms an opening of the first passage 511. According to an embodiment, the third sealing member 560 may include silicone, rubber, or another synthetic material. The third sealing member 560 may have, for example, a strap (or loop) shape.

According to an embodiment, moisture entering the opening 571 of the side member 570 may be introduced through between the side member 570 and the earphone jack housing 510 since the side member 570 and the earphone jack housing 510 are separate components. The third sealing member 560 may prevent moisture from infiltrating between the second peripheral housing 572 and the third peripheral housing 515.

According to an embodiment, a sound signal may be generated in the electronic device or come from outside the electronic device. According to an embodiment, the sound signal may be introduced through between the side member 570 and the third peripheral housing 515. According to an embodiment, the third sealing member 560 may block the introduction of the sound signal.

According to an embodiment, the third sealing member 560 may improve acoustic performance by preventing leakage of a sound signal through between the side member 570 and the third peripheral housing 515.

Figure 6A:
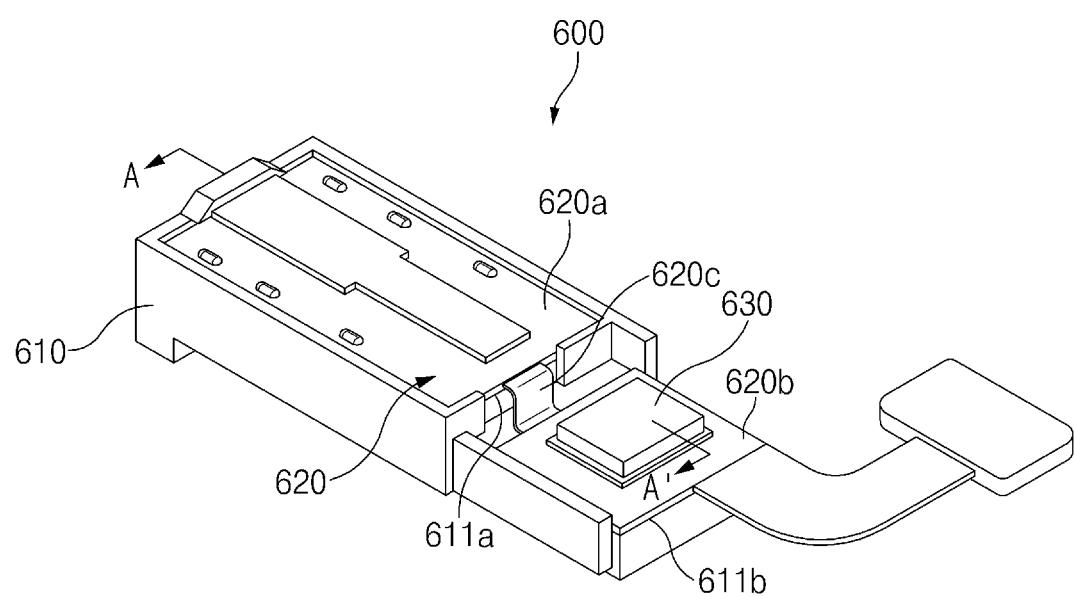
FIG. 6A is a perspective view of an earphone jack assembly including a flexible printed circuit (FPC) according to an embodiment.
Figure 6B:
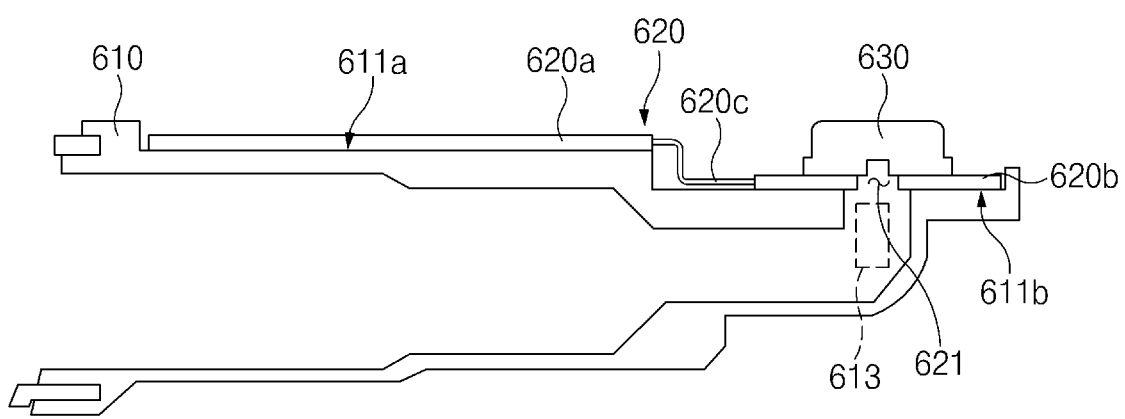
FIG. 6B is a sectional view of the earphone jack assembly including the FPC according to an embodiment.
Figure 6C:
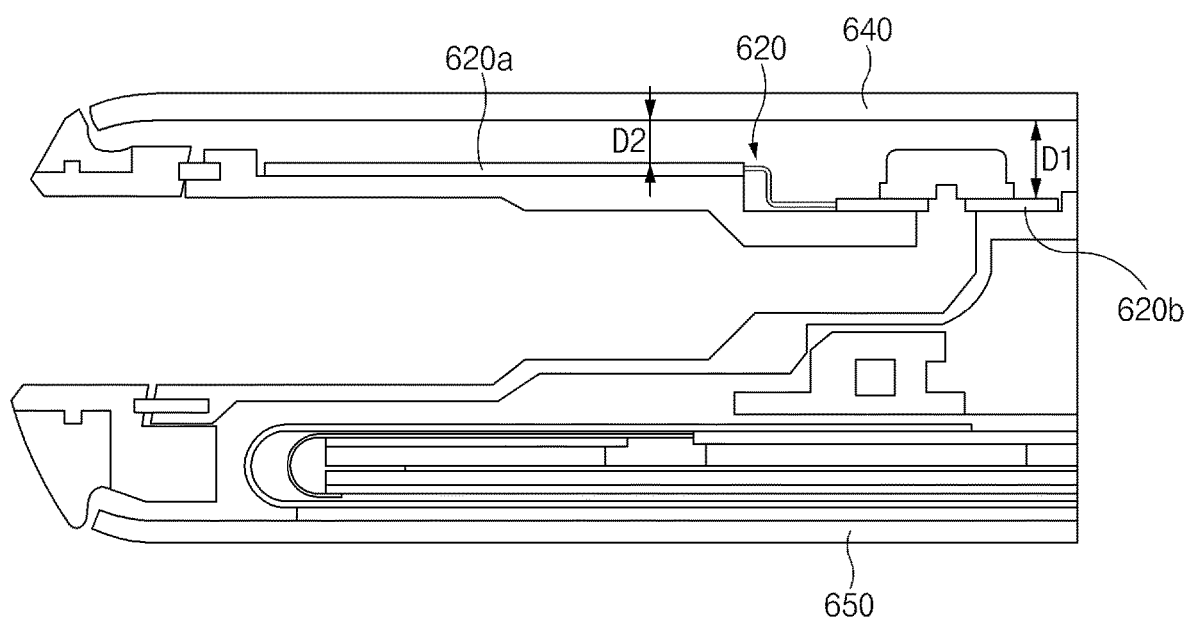
FIG. 6C is a sectional view of an earphone jack assembly including the FPC, a front plate, and a back plate according to an embodiment.

FIG. 6A is a perspective view of an earphone jack assembly including a flexible printed circuit (FPC) according to an embodiment. FIG. 6B is a sectional view of the earphone jack assembly including the FPC according to an embodiment. FIG. 6C illustrates a sectional view of an earphone jack assembly including the FPC, a front plate, and a back plate according to an embodiment. The sectional view of FIG. 6B may be a sectional view taken along line A-A' of FIG. 6A.

According to an embodiment, the earphone jack assembly 600 of FIGS. 6A and 6B may be a modified version of the earphone jack assembly 300 of FIG. 3. Referring to FIGS. 6A and 6B, the earphone jack assembly 600 may include an earphone jack housing 610, a PCB 620, a microphone 630, etc. In the description of FIGS. 6A and 6B, repetitive descriptions of the same components as those illustrated in FIG. 3 will be omitted. In the following description, the reference numerals used above may be used.

According to an embodiment, the PCB 620 may include an earphone PCB 620a (e.g., the earphone PCB 230a of FIGS. 2A and 2B), a microphone PCB 620b (e.g., the microphone PCB 230b of FIGS. 2A and 2B), and an FPC 620c.

According to an embodiment, the earphone PCB 620a may be electrically connected to at least one terminal. According to an embodiment, the microphone PCB 620b may have the microphone 630 mounted thereon. According to an embodiment, the earphone PCB 620a may be located on an earphone PCB mounting part 611a of the earphone jack housing 610, and the microphone PCB 620b may be located on a microphone PCB mounting part 611b of the earphone jack housing 610. According to an embodiment, the microphone PCB mounting part 611b may correspond to a first peripheral housing that forms an opening connected to a third passage 613. According to an embodiment, when viewed from above, at least a portion of a through-hole 621 of the microphone PCB 620b may overlap at least a portion of an opening of the third passage 613.

According to an embodiment, the flexible printed circuit (FPC) 620c may be a flexible circuit that connects the earphone PCB 620a and the microphone PCB 620b. According to various embodiments, the PCB 620, which includes the earphone PCB 620a, the microphone PCB 620b, and the FPC 620c, may be referred to as a flexible printed circuit board (FPCB).

Referring to FIGS. 6A and 6B, according to an embodiment, the earphone PCB 620a and the microphone PCB 620b may be arranged in a stepped manner. That is, a surface (e.g., an upper surface) of the earphone PCB 620a may be higher than a surface (e.g., an upper surface) of the microphone PCB 620b when viewed from the side, as shown in FIG. 6B. According to an embodiment, the earphone PCB mounting part 611a and the microphone PCB mounting part 611b of the earphone jack housing 610 may be formed in a stepped manner such that a surface of the earphone PCB 620a is higher than a surface of the microphone PCB 620b.

According to an embodiment, by connecting the earphone PCB 620a and the microphone PCB 620b through the FPC 620c, the FPC 620c may prevent heat that is generated when a terminal is soldered on the earphone PCB 620a from being transferred to the microphone 630 or a first sealing member (e.g., the first sealing member 540 of FIGS. 5A and 5B). For example, when the earphone PCB 620a is integrated with the microphone PCB 620b, the heat generated during soldering may be transferred to the microphone 630 and the first sealing member (e.g., the first sealing member 540 of FIGS. 5A and 5B) through the microphone PCB 620b. The transferred heat may cause damage to the microphone 630 or deterioration of the first sealing member. By using the FPC 620c, it may reduce the heat transferred between the microphone PCB 620b and the earphone PCB 620a.

According to an embodiment, the microphone 630 may be disposed on a surface of the microphone PCB 620b that is opposite the surface that faces the earphone jack housing 610. According to an embodiment, in the case where the microphone 630 is disposed on a surface of the microphone PCB 620b that is lower than a surface of the earphone PCB 620a, the earphone jack assembly 600 may have a smaller volume than in the case where a surface of the microphone PCB 620b is at the same level as a surface of the earphone PCB 620a. Accordingly, by mounting the PCBs in the stepped manner, the earphone jack assembly 600 may be miniaturized.

Referring to FIG. 6C, according to an embodiment, the earphone jack assembly 600 may be disposed between a back plate 640 (e.g., the back plate 180 of FIGS. 1A and 1B) and a front plate 650 (e.g., the front plate 110 of FIGS. 1A and 1B).

According to an embodiment, the PCB 620 of the earphone jack assembly 600 may be disposed between the back plate 640 and the earphone jack housing 610, and the PCB 620 of the earphone jack assembly 600 may be parallel to the back plate 640. In the case where a surface of the microphone PCB 620b is lower than a surface of the earphone PCB 620a as illustrated in FIG. 6C, the separation distance D1 between the microphone PCB 620b and the back plate 640 may be longer than the separation distance D2 between the earphone PCB 620a and the back plate 640.

According to another embodiment, the PCB 620 of the earphone jack assembly 600 may be disposed between the front plate 650 (e.g., the front plate 110 of FIGS. 1A and 1B) and the earphone jack housing 610. In this example, the separation distance between the microphone PCB 620b and the front plate 650 may be longer than the separation distance between the earphone PCB 620a and the front plate 650.

As described above with reference to FIGS. 6A to 6C, heat transferred from the earphone PCB 620a to the microphone PCB 620b may be reduced by connecting the earphone PCB 620a and the microphone PCB 620b through the FPC 620c. In addition, since the FPC 620c is made of a flexible material, the FPC 620c enables the earphone PCB 620a and the microphone PCB 620b to be arranged in a stepped manner.

Figure 7A:
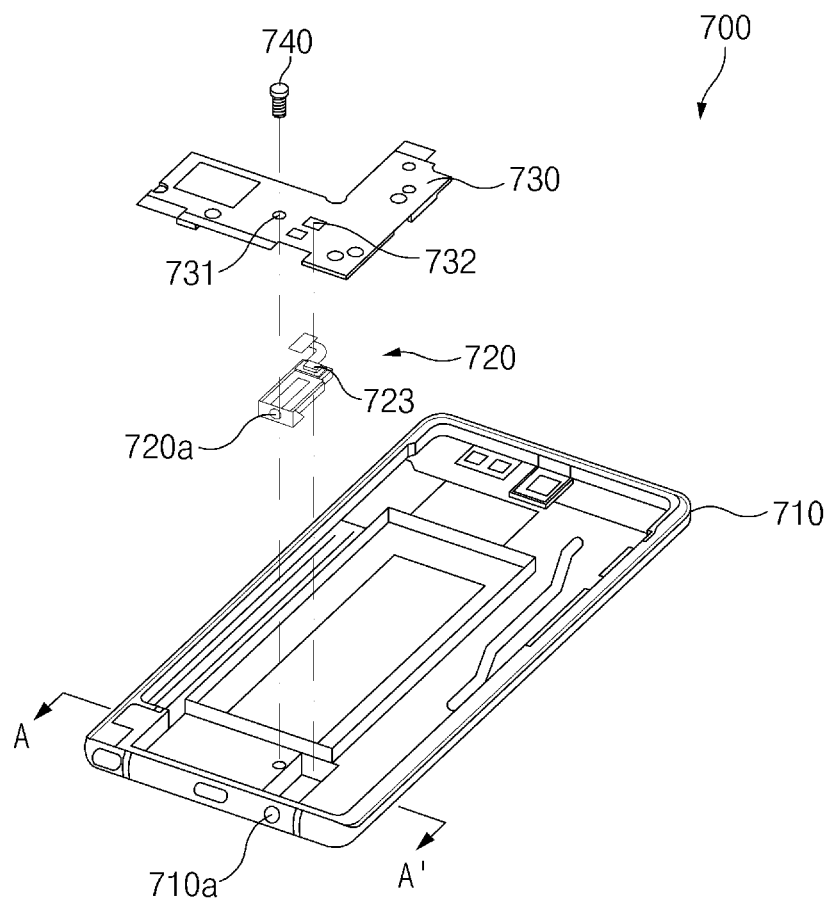
FIG. 7A is an exploded perspective view of an earphone jack assembly disposed between a support member and a side member according to an embodiment.
Figure 7B:
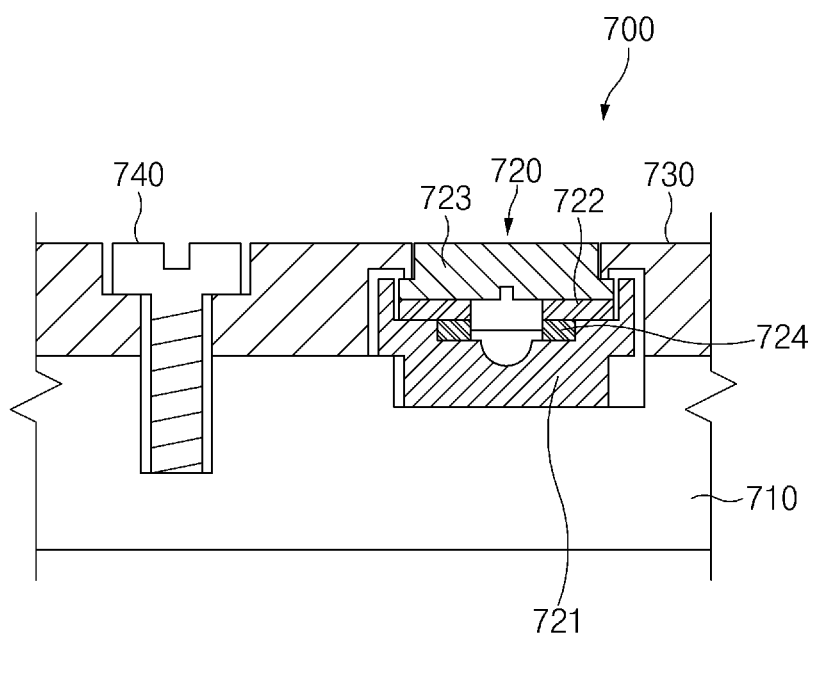
FIG. 7B is a sectional view of the earphone jack assembly disposed between the support member and the side member according to an embodiment.

FIG. 7A is an exploded perspective view of an earphone jack assembly disposed between a support member and a side member according to an embodiment. FIG. 7B is a sectional view of the earphone jack assembly disposed between the support member and the side member according to an embodiment.

Referring to FIGS. 7A and 7B, an electronic device 700 may include a side member 710, an earphone jack assembly 720, a support member 730, a coupling member 740, etc. According to various other embodiments, the electronic device 700 (e.g., the electronic device 100 of FIGS. 1A and 1B) may further include components that are not illustrated in FIGS. 7A and 7B. In the following description, the reference numerals used above may be used.

According to an embodiment, the support member 730 may support the earphone jack assembly 720 such that the earphone jack assembly 720 is stably secured to the side member 710. According to an embodiment, the support member 730 may be disposed to cover at least a portion of the earphone jack assembly 720, which is disposed on the side member 710. For example, the earphone jack assembly 720 may be located between the side member 710 and the support member 730.

According to an embodiment, the support member 730 may have a flat plate shape and may be disposed parallel to at least one of a front plate (e.g., the front plate 110 of FIGS. 1A and 1B), a back plate (e.g., the back plate 180 of FIGS. 1A and 1B), and the side member 710. According to an embodiment, the support member 730 may include at least one opening 731 through which the coupling member 740 may pass. According to an embodiment, the support member 730 may further include a microphone aperture 732 aligned with a microphone 723 of the earphone jack assembly 720.

According to an embodiment, the coupling member 740 (e.g., a screw) may be used to couple the support member 730 and the side member 710. Referring to FIGS. 7A and 7B, the coupling member 740 may pass through the opening 731 of the support member 730 and may be inserted into the side member 710 to couple the support member 730 and the side member 710. According to another embodiment, the coupling member 740 may be omitted and the earphone jack assembly 720 may be secured using another method.

Referring to FIGS. 7A and 7B, the earphone jack assembly 720 may be disposed on at least a portion of the side member 710 such that an opening 720a of the earphone jack assembly 720 is aligned with an opening 710a of the side member 710. According to an embodiment, the support member 730 may be disposed such that at least one surface thereof covers at least a portion of the microphone 723 or the microphone PCB 722. According to an embodiment, the microphone aperture 732 of the support member 730 may be aligned with the microphone 723 while the microphone 723 is mounted on the microphone PCB 722 when the support member 730 is disposed to cover at least a portion of the microphone PCB 722. According to this design, the microphone 723 or the microphone PCB 722 may be brought into close contact with an earphone jack housing 721 by coupling the support member 730 and the side member 710 through the coupling member 740. According to an embodiment, when a first sealing member 724 (e.g., the first sealing member 540 of FIG. 5) is disposed between the microphone PCB 722 and the earphone jack housing 721, the support member 730 and the coupling member 740 may force the first sealing member 724 to be in close contact with the earphone jack housing 721, thereby improving waterproofing performance of this assembly.

Figure 8A:
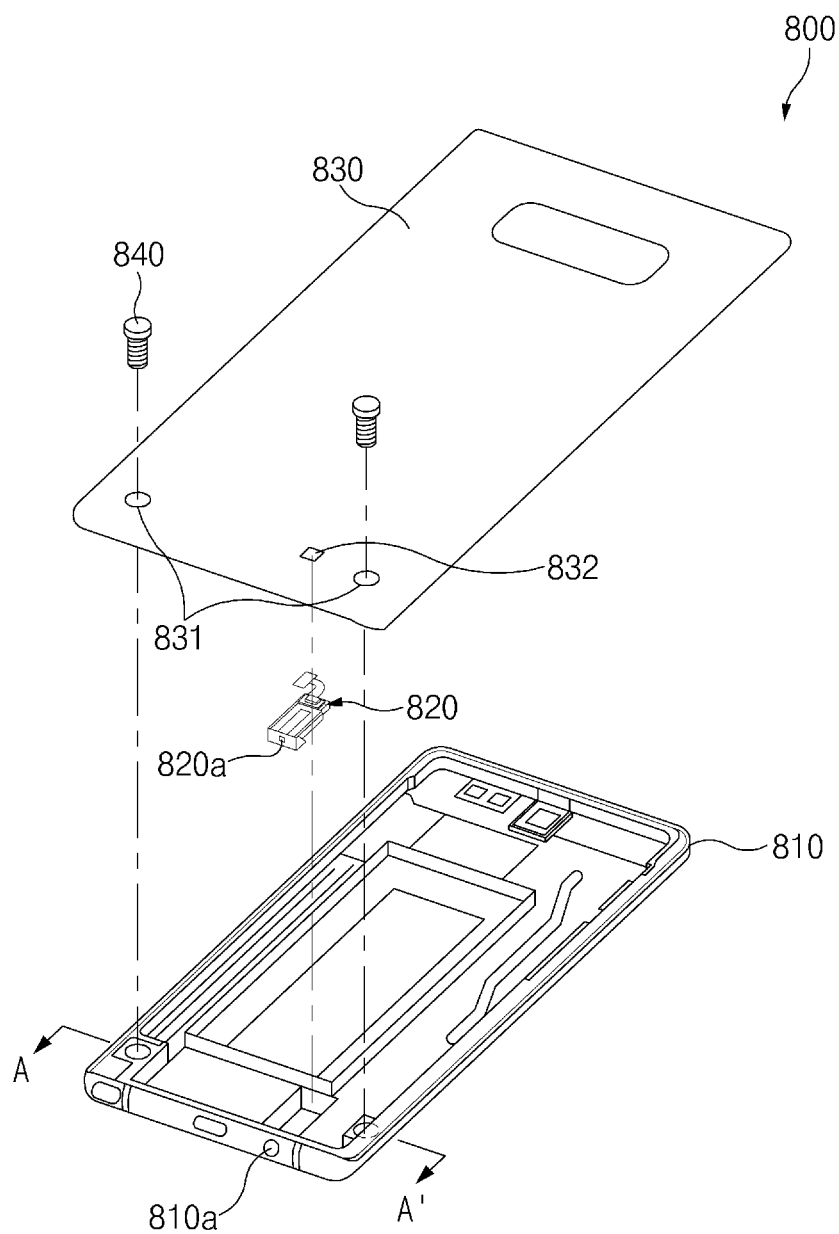
FIG. 8A is an exploded perspective view of an earphone jack assembly disposed between a back plate and a side member according to an embodiment.
Figure 8B:
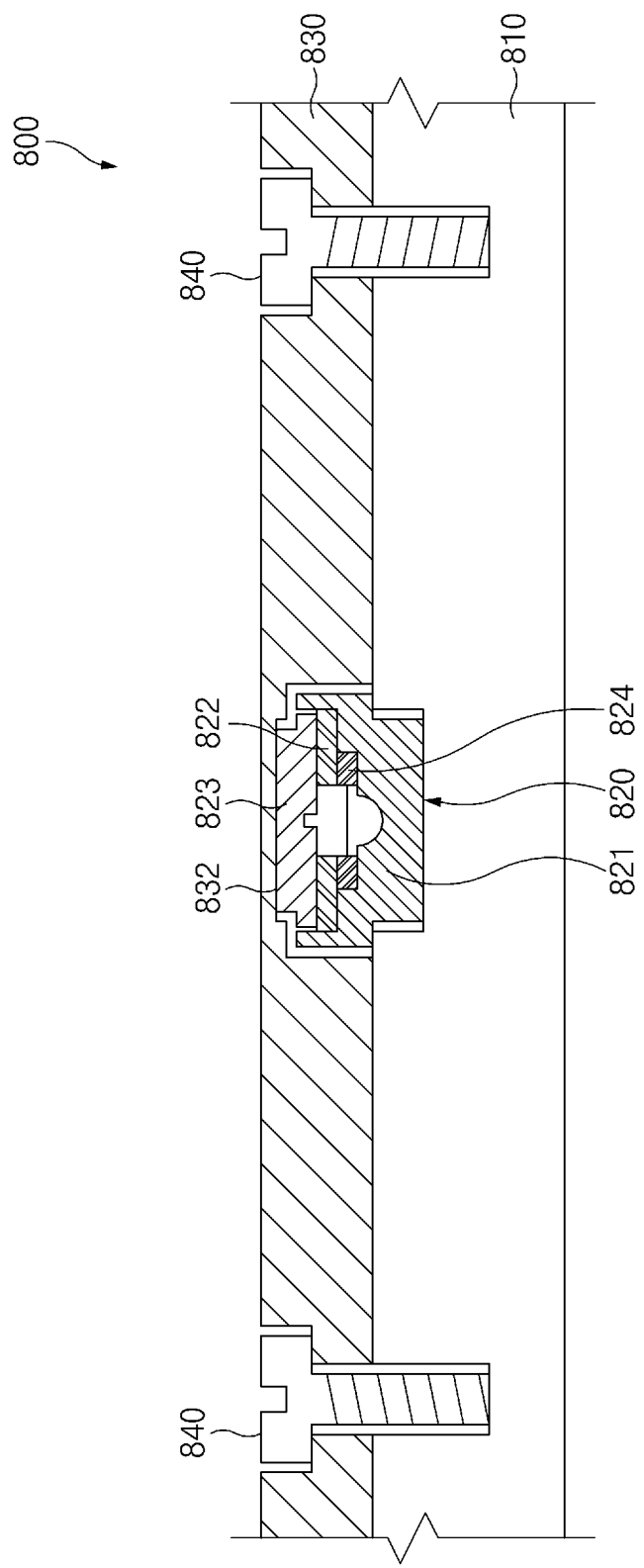
FIG. 8B is a sectional view of the earphone jack assembly disposed between the back plate and the side member according to an embodiment.

FIG. 8A is an exploded perspective view of an earphone jack assembly disposed between a back plate and a side member according to an embodiment. FIG. 8B is a sectional view of the earphone jack assembly disposed between the back plate and the side member according to an embodiment.

Referring to FIGS. 8A and 8B, an electronic device 800 may include a side member 810, an earphone jack assembly 820, a back plate 830, a coupling member 840, etc. According to various other embodiments, the electronic device 800 (e.g., the electronic device 100 of FIGS. 1A and 1B) may further include components that are not illustrated in FIGS. 8A and 8B. In the following description, the reference numerals used above may be used.

According to an embodiment, as illustrated in FIGS. 8A and 8B, the earphone jack assembly 820 may be disposed between the side member 810 and the back plate 830. According to an embodiment, the back plate 830 may support the earphone jack assembly 820 such that the earphone jack assembly 820 is stably secured to the side member 810. According to an embodiment, the back plate 830 may be disposed to cover at least a portion of the earphone jack assembly 820, which is disposed on the side member 810.

According to an embodiment, the back plate 830 may include at least one opening 831 through which the coupling member 840 may pass. According to an embodiment, the back plate 830 may include, on at least a portion of a surface facing the side member 810, a microphone groove 832 corresponding to the shape of a microphone 823.

According to an embodiment, the coupling member 840 may be used to couple the back plate 830 and the side member 810. Referring to FIGS. 8A and 8B, the coupling member 840 may pass through the opening 831 of the back plate 830 and may be inserted into the side member 810 to couple the back plate 830 and the side member 810. According to another embodiment, the coupling member 840 may be omitted and the earphone jack assembly 820 may be secured using another method.

Referring to FIGS. 8A and 8B, the earphone jack assembly 820 may be disposed on at least a portion of the side member 810 such that an opening 820a of the earphone jack assembly 820 is aligned with an opening 810a of the side member 810. According to an embodiment, the back plate 830 may be disposed such that at least one surface thereof covers at least a portion of the microphone 823 or the microphone PCB 822. According to an embodiment, the microphone groove 832 of the back plate 830 may be aligned with the microphone 823 while the microphone 823 is mounted on the microphone PCB 822 when the back plate 830 is disposed to cover at least a portion of the microphone PCB 822. According to this design, the microphone 823 or the microphone PCB 822 may be brought into close contact with an earphone jack housing 821 by coupling the back plate 830 and the side member 810 through the coupling member 840. According to an embodiment, when a first sealing member 824 is disposed between the microphone PCB 822 and the earphone jack housing 821, the back plate 830 and the coupling member 840 may force the first sealing member 824 to be in close contact with the earphone jack housing 821, thereby improving waterproofing performance of this assembly.

Figure 9A:
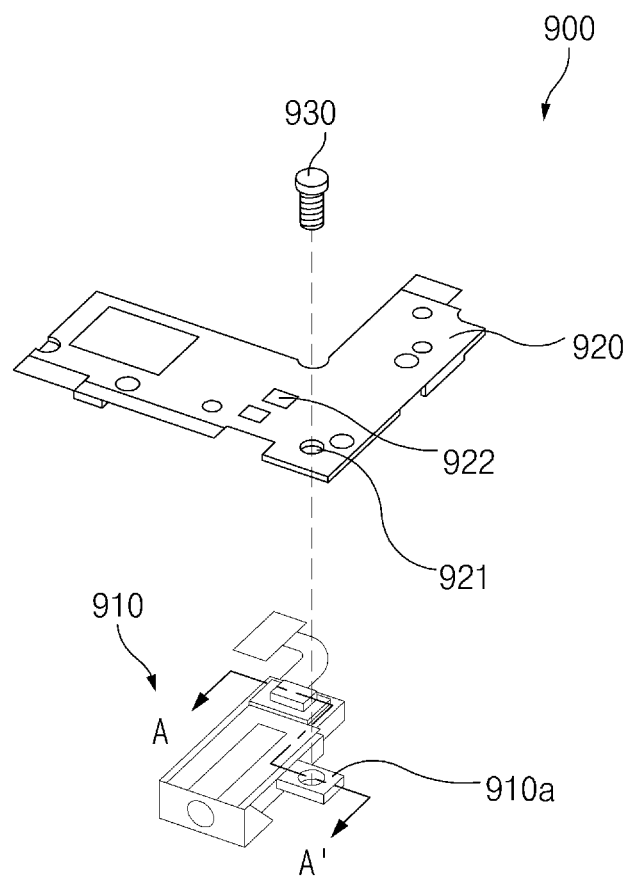
FIG. 9A is an exploded perspective view of an earphone jack assembly disposed between a support member and a side member according to an embodiment.
Figure 9B:
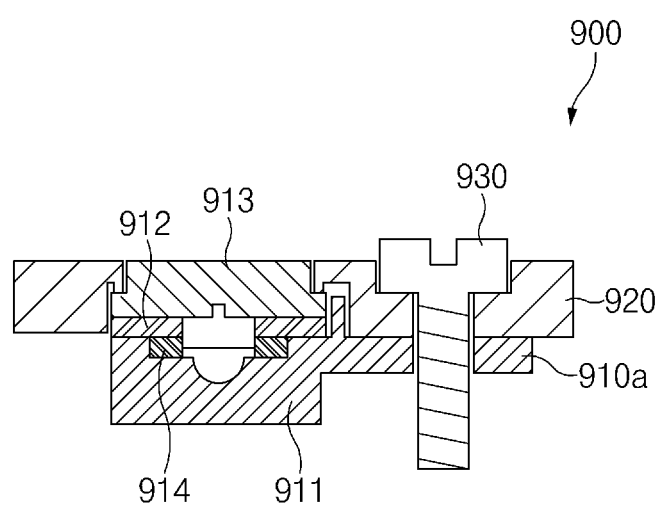
FIG. 9B is a sectional view of the earphone jack assembly disposed between the support member and the side member according to an embodiment.

FIG. 9A is an exploded perspective view of an earphone jack assembly disposed between a support member and a side member according to an embodiment. FIG. 9B is a sectional view of the earphone jack assembly disposed between the support member and the side member according to an embodiment.

Referring to FIGS. 9A and 9B, an electronic device 900 may include an earphone jack assembly 910, a support member 920, a coupling member 930, etc. According to various other embodiments, the electronic device 900 (e.g., the electronic device 100 of FIGS. 1A and 1B) may further include components that are not illustrated in FIGS. 9A and 9B. In the following description, the reference numerals used above may be used.

According to an embodiment, the earphone jack assembly 910 may include a coupling part 910a that includes a hole into which the coupling member 930 is inserted.

According to an embodiment, as illustrated in FIGS. 9A and 9B, the support member 920 may be coupled to the earphone jack assembly 910 through the coupling member 930. According to an embodiment, the support member 920 may be disposed to cover at least a portion of the earphone jack assembly 910.

According to an embodiment, the support member 920 may have a flat plate shape and may include at least one opening 921 through which the coupling member 930 may pass. According to an embodiment, the support member 920 may further include a microphone aperture 922 to be aligned with the microphone 913 of the earphone jack assembly 910.

According to an embodiment, the coupling member 930 may be used to couple the support member 920 and the earphone jack assembly 910. Referring to FIGS. 9A and 9B, the coupling member 930 may pass through the opening 921 of the support member 920 and may be inserted into the coupling part 910a to couple the support member 920 and the earphone jack assembly 910.

Referring to FIGS. 9A and 9B, the support member 920 may be disposed such that at least one surface thereof covers at least a portion of the microphone 913 or the microphone PCB 912. According to an embodiment, the microphone aperture 922 of the support member 920 may be aligned with the microphone 913 mounted on the microphone PCB 912 when the support member 920 is disposed to cover at least a portion of the microphone PCB 912. According to this design, the microphone 913 or the microphone PCB 912 may be brought into close contact with the earphone jack housing 911 by coupling the support member 920 and the earphone jack assembly 910 through the coupling member 930. This way, the microphone 913 or the microphone PCB 912 is pressed against the earphone jack housing 911 by the support member 920. According to an embodiment, when a first sealing member 914 is disposed between the microphone PCB 912 and the earphone jack housing 911, the support member 920 and the coupling member 930 may force the first sealing member 914 to be in close contact with the earphone jack housing 911, thereby improving waterproofing performance of this assembly.

An electronic device (e.g., the electronic device 100 of FIGS. 1A and 1B) according to an embodiment may include a housing including a first plate 110, a second plate 180 facing away from the first plate 110, and a side member surrounding a space between the first plate 110 and the second plate 180 and including an opening 131, a touch screen display 120 exposed through the first plate 110, and an earphone jack assembly 140 disposed to align with the opening 131. The earphone jack assembly 140 may include at least one structure 310 including a first passage 311 having a first cross-sectional area, a second passage 312 having a second cross-sectional area smaller than the first cross-sectional area, and a third passage 313 and a microphone 330 disposed outside of the structure 310 and including a substrate having a hole 330a connected to the third passage 313. The first passage 311 may extend from the opening 131 in a first direction to accommodate an external earphone connector, and may include a first end 311a connected to the opening 131 and a second end 311b opposite to the first end 311a. The second passage 312 may extend from the second end 311b of the first passage 311 in the first direction, and the third passage 313 may extend from the second passage 312 in a second direction different from the first direction.

In an embodiment, the second direction may be perpendicular to the first direction.

In an embodiment, the electronic device may further include a flexible printed circuit board (FPCB) disposed outside of the at least one structure 310.

In an embodiment, the microphone 630 may be mounted on the FPCB such that a portion of the FPCB is located between the at least one structure 310 and the microphone 630.

In an embodiment, the FPCB may include a through-hole 321 that connects a hole 330a of the microphone to the third passage 313.

An input/output module 140 according to an embodiment may include an earphone jack housing 310 including a first passage 311, 312 and a second passage 313 and a microphone 330 disposed on a first peripheral housing 514 of the earphone jack housing 310, where the first peripheral housing 514 includes an opening connected to the second passage 313, and the microphone 330 including a hole 330a connected to the second passage 313. The first passage 311 may accommodate an external earphone connector inserted through another opening, may extend from the other opening in a first direction, and may include a first end 311a connected to the other opening and a second end 311b opposite to the first end 311a. The second passage 312 may extend from the second end in a second direction different from the first direction.

In an embodiment, the second direction may be perpendicular to the first direction.

In an embodiment, an area of a first cross section of the first passage may be smaller than an area of a second cross section of the first passage and the first cross section may be closer to the second end than the second passage 313.

In an embodiment, the earphone jack housing 410 may further include a stopper 412a protruding from a sidewall of the first passage 411 or the second passage 412.

In an embodiment, the input/output module may further include a waterproof member 540 disposed between the first peripheral housing 514 and the microphone 530.

In an embodiment, the waterproof member 540 may prevent moisture infiltration toward the microphone 530 from the second passage 512 and may discharge moisture toward the second passage 512 from the microphone 530.

In an embodiment, the input/output module may further include at least one contact terminal 220 electrically connected to the external earphone connector when the external earphone connector is inserted into the first passage and a printed circuit board (PCB) disposed on at least a portion of the earphone jack housing, and the PCB may include an earphone PCB 620a electrically connected to the at least one contact terminal 220, a microphone PCB 620b electrically connected to the microphone 630, and a flexible printed circuit (FPC) 620c that electrically connects the earphone PCB 620a and the microphone PCB 620b.

In an embodiment, the earphone PCB 620a and the microphone PCB 620b may be arranged in a stepped manner.

In an embodiment, the microphone PCB 620b may include a through-hole located between the microphone 630 and the first peripheral housing so as to connect the hole of the microphone 630 to the third passage.

An electronic device 100 according to an embodiment may include a housing including a first plate 110, a second plate 180 facing away from the first plate 110, and a side member 130 surrounding a space between the first plate 110 and the second plate 180 and including a first opening 131 and an input/output module 140 disposed between the first plate 110 and the second plate 180. The input/output module 140 may include an earphone jack housing 310 including a first passage 311 having a second opening, a second passage 312, and a third passage 313 and a microphone 330 disposed on a first peripheral housing that forms a third opening connected to the third passage 313 and including a hole connected to the third passage 313. The first passage 311 may accommodate an external earphone connector inserted through the first opening 131 and the second opening, may extend from the second opening in a first direction, and may include a first end 311a connected to the second opening and a second end 311b opposite to the first end 311a. The second passage 312 may extend from the second end 311b in the first direction, and the third passage 313 may extend from the second passage 312 in a second direction different from the first direction. The second direction may be a direction toward the first plate 110 or the second plate 180.

In an embodiment, the input/output module 140 may further include at least one contact terminal 220 electrically connected to the external earphone connector when the external earphone connector is inserted into the first passage and a printed circuit board (PCB) including an earphone PCB 620a electrically connected to the at least one contact terminal 220, a microphone PCB 620b electrically connected to the microphone 630, and a flexible printed circuit (FPC) 620c that electrically connects the earphone PCB 620a and the microphone PCB 620b. The PCB may be disposed between the first or second plate 110 or 180 and at least a portion of the earphone jack housing.

In an embodiment, the microphone PCB 620b may be disposed between the microphone 630 and the first peripheral housing, and a separation distance between the microphone PCB 620b and the first plate 110 may be longer than a separation distance between the earphone PCB 620a and the first plate 110 when the PCB is disposed between the first plate 110 and the at least a portion of the earphone jack housing.

In an embodiment, the electronic device may further include a sealing member 560 disposed between a second peripheral housing that forms the first opening 131 and a third peripheral housing that forms the second opening.

In an embodiment, the electronic device may further include a support member 730 disposed between the first plate 110 and the second plate 180 and a coupling member 740 that couples the support member 730 to the side member 130 or the second plate 180. The support member 730 may be disposed such that the input/output module 140 is located between the support member 730 and the first or second plate 110 or 180 and the support member may be coupled to the side member 130 or the second plate 180 such that the microphone 723 is in close contact with the earphone jack housing.

In an embodiment, the electronic device may further include a support member 920 disposed between the first plate 110 and the second plate 180 and a coupling member 930 that couples the support member 920 to the earphone jack housing 910. The support member 920 may be arranged in the second direction with respect to the earphone jack housing 910 and may force the microphone 913 to be in close contact with the earphone jack housing 910.

The electronic device according to various embodiments disclosed in the present disclosure may be various types of devices. The electronic device may include, for example, at least one of a portable communication device (e.g., a smartphone), a computer device, a portable multimedia device, a mobile medical appliance, a camera, a wearable device, or a home appliance. The electronic device according to an embodiment of the present disclosure should not be limited to the above-mentioned devices.

It should be understood that various embodiments of the present disclosure and terms used in the embodiments are not intended to limit technologies disclosed in the present disclosure to the particular embodiments disclosed herein. Rather, the present disclosure should be construed to cover various modifications, equivalents, and/or alternatives of embodiments of the present disclosure. As used herein, singular forms may include plural forms as well unless the context clearly indicates otherwise. In the present disclosure disclosed herein, the expressions "A or B," "at least one of A or/and B," "A, B, or C," or "one or more of A, B, or/and C," and the like used herein may include any and all combinations of one or more of the associated listed items. The expressions "a first," "a second," "the first," or "the second" used herein may refer to corresponding components without implying an order of importance, and are used merely to distinguish each component from the others without unduly limiting the components. It should be understood that when a component (e.g., a first component) is referred to as being (operatively or communicatively) "connected," or "coupled," to another component (e.g., a second component), it may be directly connected or coupled directly to the other component or any other component (e.g., a third component) may be interposed between them.

The term "module" used herein may represent, for example, a unit including one or more combinations of hardware, software and firmware. The term "module" may be interchangeably used with the terms "logic," "logical block," "part," or "circuit." The "module" may be an integrated component or a portion thereof. For example, the "module" may include an application-specific integrated circuit (ASIC).

Each component according to various embodiments may include at least one of the above-mentioned components, a portion of the above sub-components may be omitted, or additional other sub-components may be further included. Alternatively or additionally, some components may be integrated in one component and may perform the same or similar functions performed by each corresponding components prior to the integration.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
   a housing including an opening;
   a touch screen display exposed through a surface of the housing; and
   an earphone jack assembly disposed to align with the opening,
   wherein the earphone jack assembly includes:
     at least one structure including a first passage having a first cross-sectional area, a second passage having a second cross-sectional area smaller than the first cross-sectional area, and a third passage, wherein the first passage extends from the opening in a first direction to accommodate an external earphone connector, and includes a first end connected to the opening and a second end opposite to the first end, the second passage extends from the second end of the first passage in the first direction, and the third passage extends from the second passage in a second direction different from the first direction; and
     a microphone disposed outside of the at least one structure and including a substrate having a hole connected to the third passage.

2. The electronic device of claim 1, wherein the second direction is perpendicular to the first direction.

3. The electronic device of claim 1, further comprising:
   a flexible printed circuit board (FPCB) disposed outside of the at least one structure.

4. The electronic device of claim 3, wherein the microphone is mounted on the FPCB such that a portion of the FPCB is located between the at least one structure and the microphone.

5. The electronic device of claim 4, wherein the FPCB includes a through-hole connecting a hole of the microphone to the third passage.

6. An input/output module comprising:
   an earphone jack housing including a first passage and a second passage, wherein the first passage accommodates an external earphone connector inserted through an opening and extends from the opening in a first direction, the first passage including a first end connected to the opening and a second end opposite to the first end, the second passage extends from the second end in a second direction different from the first direction;
   at least one contact terminal disposed on a surface of the first passage to make electrical contact with the external earphone connector, when the external earphone connector is inserted through the opening; and
   a microphone disposed on a first peripheral housing of the earphone jack housing, wherein the first peripheral housing includes another opening connected to the second passage, and the microphone includes a hole connected to the second passage through the other opening.

7. The input/output module of claim 6, wherein the second direction is perpendicular to the first direction.

8. The input/output module of claim 6, wherein an area of a first cross section of the first passage is smaller than an area of a second cross section of the first passage and the first cross section is closer to the second end than the second passage.

9. The input/output module of claim 6, wherein the earphone jack housing further comprises a stopper protruding from a sidewall of the first passage.

10. The input/output module of claim 6, further comprising:
    a waterproof member disposed between the first peripheral housing and the microphone.

11. The input/output module of claim 10, wherein the waterproof member prevents moisture infiltration toward the microphone from the second passage and discharges moisture toward the second passage from the microphone.

12. The input/output module of claim 6, further comprising:
    a printed circuit board (PCB) disposed on at least a portion of the earphone jack housing, wherein the PCB includes an earphone PCB electrically connected to the at least one contact terminal, a microphone PCB electrically connected to the microphone, and a flexible printed circuit (FPC) configured to electrically connect the earphone PCB and the microphone PCB.

13. The input/output module of claim 12, wherein the earphone PCB and the microphone PCB are arranged in a stepped manner.

14. The input/output module of claim 12, wherein the microphone PCB includes a through-hole located between the microphone and the first peripheral housing so as to connect the hole of the microphone to the second passage.

15. An electronic device comprising:
    a housing including a first plate, a second plate facing away from the first plate, and a side member surrounding a space between the first plate and the second plate and including a first opening; and
    an input/output module disposed between the first plate and the second plate,
    wherein the input/output module includes:
    an earphone jack housing including a first passage having a second opening, a second passage, and a third passage, wherein the first passage accommodates an external earphone connector inserted through the first opening and the second opening and extends from the second opening in a first direction, the first passage including a first end connected to the second opening and a second end opposite to the first end, the second passage extends from the second end in the first direction, and the third passage extends from the second passage in a second direction different from the first direction; and
    a microphone disposed on a first peripheral housing of the earphone jack housing, wherein the first peripheral housing includes a third opening connected to the third passage, and the microphone includes a hole connected to the third passage through the third opening, and
    wherein the second direction is a direction toward the first plate or the second plate.

16. The electronic device of claim 15, wherein the input/output module further includes:
- at least one contact terminal electrically connected to the external earphone connector when the external earphone connector is inserted into the first passage; and
- a printed circuit board (PCB) including an earphone PCB electrically connected to the at least one contact terminal, a microphone PCB electrically connected to the microphone, and a flexible printed circuit (FPC) configured to electrically connect the earphone PCB and the microphone PCB, and
- wherein the PCB is disposed between the first or second plate and at least a portion of the earphone jack housing.

17. The electronic device of claim 16, wherein the microphone PCB is disposed between the microphone and the first peripheral housing, and
- wherein a separation distance between the microphone PCB and the first plate is longer than a separation distance between the earphone PCB and the first plate when the PCB is disposed between the first plate and the at least a portion of the earphone jack housing.

18. The electronic device of claim 15, further comprising:
- a sealing member disposed between a second peripheral housing configured to form the first opening and a third peripheral housing configured to form the second opening.

19. The electronic device of claim 15, further comprising:
- a support member disposed between the first plate and the second plate; and
- a coupling member configured to couple the support member to the side member or the second plate,
- wherein the support member is disposed such that the input/output module is located between the support member and the first or second plate, and the support member is coupled to the side member or the second plate such that the microphone is in close contact with the earphone jack housing.

20. The electronic device of claim 15, further comprising:
- a support member disposed between the first plate and the second plate; and
- a coupling member configured to couple the support member to the earphone jack housing,
- wherein the support member is arranged in the second direction with respect to the earphone jack housing and forces the microphone to be in close contact with the earphone jack housing.

* * * * *